US006777686B2

(12) United States Patent
Olson et al.

(10) Patent No.: US 6,777,686 B2
(45) Date of Patent: Aug. 17, 2004

(54) CONTROL SYSTEM FOR INDIRECTLY HEATED CATHODE ION SOURCE

(75) Inventors: Joseph C. Olson, Beverly, MA (US); Daniel Distaso, Merrimac, MA (US); Anthony Renau, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 286 days.

(21) Appl. No.: 09/825,901

(22) Filed: Apr. 4, 2001

(65) Prior Publication Data

US 2001/0042836 A1 Nov. 22, 2001

Related U.S. Application Data

(60) Provisional application No. 60/204,938, filed on May 17, 2000, and provisional application No. 60/204,936, filed on May 17, 2000.

(51) Int. Cl.[7] .................................................. H01J 37/08
(52) U.S. Cl. ............... 250/423 R; 250/427; 315/111.81
(58) Field of Search ............................. 250/423 R, 427; 315/111.81

(56) References Cited

U.S. PATENT DOCUMENTS

| | | | | |
|---|---|---|---|---|
| 3,621,324 A | | 11/1971 | Fink | |
| 4,743,767 A | * | 5/1988 | Plumb et al. | 250/398 |
| 4,754,200 A | * | 6/1988 | Plumb et al. | 250/423 R |
| 5,497,006 A | | 3/1996 | Sferlazzo et al. | |
| 5,703,372 A | | 12/1997 | Horsky et al. | |
| 5,763,890 A | | 6/1998 | Cloutier et al. | |
| 5,825,035 A | * | 10/1998 | Mizumura et al. | 250/423 R |
| 6,259,210 B1 | * | 7/2001 | Wells | 250/423 R |

FOREIGN PATENT DOCUMENTS

| | | |
|---|---|---|
| CH | 252249 | 12/1947 |
| EP | 0215626 | 3/1987 |
| EP | 0840346 | 5/1998 |
| EP | 0851453 | 7/1998 |
| FR | 1053508 | 2/1954 |
| FR | 2105407 | 11/1971 |
| GB | 2327513 | 1/1999 |
| WO | WO 97/32335 | 9/1997 |
| WO | WO 99/04409 | 1/1999 |

* cited by examiner

*Primary Examiner*—Jack Berman

(57) ABSTRACT

An indirectly heated cathode ion source includes an extraction current sensor for sensing ion current extracted from the arc chamber and an ion source controller for controlling the filament power supply, the bias power supply and/or the arc power supply. The ion source controller may compare the sensed extraction current with a reference extraction current and determine an error value based on the difference between the sensed extraction current and the reference extraction current. The power supplies of the indirectly heated cathode ion source are controlled to minimize the error value, thus maintaining a substantially constant extraction current. The ion source controller utilizes a control algorithm, for example a closed feedback loop, to control the power supplies in response to the error value. In a first control algorithm, the bias current $I_B$ supplied by the bias power supply is varied so as to control the extraction current $I_E$. Further according to the first control algorithm, the filament current $I_F$ and the arc voltage $V_A$ are maintained constant. According to a second control algorithm, the filament current $I_F$ is varied so as to control the extraction current $I_E$. Further according to the second control algorithm, the bias current $I_B$ and the arc voltage $V_A$ are maintained constant.

10 Claims, 7 Drawing Sheets

CONTROL SYSTEM FOR INDIRECTLY HEATED CATHODE ION SOURCE

CROSS REFERENCE TO RELATED APPLICATIONS

This application claims the benefit of provisional application Ser. No. 60/204,936 filed May 17, 2000 and provisional application Ser. No. 60/204,938 filed May 17, 2000.

FIELD OF THE INVENTION

This invention is related to ion sources that are suitable for use in ion implanters and, more particularly, to ion sources having indirectly heated cathodes.

BACKGROUND OF THE INVENTION

An ion source is a critical component of an ion implanter. The ion source generates an ion beam which passes through the beamline of the ion implanter and is delivered to a semiconductor wafer. The ion source is required to generate a stable, well-defined beam for a variety of different ion species and extraction voltages. In a semiconductor production facility, the ion implanter, including the ion source, is required to operate for extended periods without the need for maintenance or repair.

Ion implanters have conventionally used ion sources with directly heated cathodes, wherein a filament for emitting electrons is mounted in the arc chamber of the ion source and is exposed to the highly corrosive plasma in the arc chamber. Such directly heated cathodes typically constitute a relatively small diameter wire filament and therefore degrade or fail in the corrosive environment of the arc chamber in a relatively short time. As a result, the lifetime of the directly heated cathode ion source is limited.

Indirectly heated cathode ion sources have been developed in order to improve ion source lifetimes in ion implanters. An indirectly heated cathode includes a relatively massive cathode which is heated by electron bombardment from a filament and emits electrons thermionically. The filament is isolated from the plasma in the arc chamber and thus has a long lifetime. Although the cathode is exposed to the corrosive environment of the arc chamber, its relatively massive structure ensures operation over an extended period.

The cathode in the indirectly heated cathode ion source must be electrically isolated from its surroundings, electrically connected to a power supply and thermally isolated from its surroundings to inhibit cooling which would cause it to stop emitting electrons. Known prior art indirectly heated cathode designs utilize a cathode in the form of a disk supported at its outer periphery by a thin wall tube of approximately the same diameter as the disk. The tube has a thin wall in order to reduce its cross sectional area and thereby reduce the conduction of heat away from the hot cathode. The thin tube typically has cutouts along its length to act as insulating breaks and to reduce the conduction of heat away from the cathode.

The tube used to support the cathode does not emit electrons, but has a large surface area, much of it at high temperature. This area loses heat by radiation, which is the primary way that the cathode loses heat. The large diameter of the tube increases the size and complexity of the structure used to clamp and connect to the cathode. One known cathode support includes three parts and requires threads to assemble.

The indirectly heated cathode ion source typically includes a filament power supply, a bias power supply and an arc power supply and requires a control system for regulating these power supplies. Prior art control systems for indirectly heated cathode ion sources regulate the supplies to achieve constant arc current. A difficulty in using a constant arc current system is that, if the beamline is tuned, beam current measured at the downstream end of the beamline can increase either due to the tuning, which increases the percent of current transmitted through the beamline, or due to an increase in the amount of current extracted from the source. Since beam current and transmission are influenced by the same plurality of variables, it difficult to tune for maximum beam current transmission.

A prior art approach that has been utilized in ion sources with directly heated cathodes is to control the source for constant extraction current rather than constant arc current. In all cases where the source is controlled for constant extraction current, the control system drives a Bernas type ion source where the cathode is a directly heated filament.

SUMMARY OF THE INVENTION

According to an aspect of the invention, an indirectly heated cathode ion source includes an arc chamber housing defining an arc chamber having an extraction aperture, an extraction electrode positioned outside of the arc chamber in front of the extraction aperture, an indirectly heated cathode positioned within the arc chamber, and a filament for heating the cathode. A filament power supply provides a current for heating the filament, a bias power supply provides a voltage between the filament and the cathode, an arc power supply provides a voltage between the cathode and the arc chamber housing, and an extraction power supply provides a voltage between the arc chamber housing and the extraction electrode, for extracting from the arc chamber an ion beam having a beam current. The ion source further includes an ion source controller for controlling the beam current extracted from the arc chamber at or near a reference extraction current. The ion source may also include an extraction current sensor for sensing an extraction power supply current that is representative of the extracted beam current and, in another embodiment, a suppression electrode positioned between the arc chamber housing and the extraction electrode and a suppression power supply coupled between the suppression electrode and ground.

The ion source controller may include feedback means for controlling the extracted beam current in response to an error value based on the difference between a sensed beam current and the reference extraction current. In one embodiment, the feedback means may include means for controlling a bias current supplied by the bias power supply in response to the error value. In another embodiment, the feedback means may include means for controlling a filament current supplied by the filament power supply in response to the error value. The feedback means may include a Proportional-Integral-Derivative controller. The indirectly heated cathode ion source, including a cathode and a filament for heating the cathode, may be controlled by sensing a beam current extracted from the ion source, and controlling a bias current between the filament and the cathode in response to an error value based on the difference between the sensed beam current and a reference extraction current.

In a first control algorithm, a beam current extracted from the ion source is sensed and a bias current between the filament and the cathode is controlled in response to an error value based on the difference between the sensed beam current and a reference extraction current. The algorithm may further include maintaining a filament current and an arc voltage at a constant value, and not regulating a filament voltage and an arc current.

In a second control algorithm, a beam current extracted from the ion source is sensed and a filament current through the filament is controlled in response to an error value based on the difference between the sensed beam current and a reference extraction current. The algorithm may further include maintaining a bias current and an arc voltage at a constant value, and not regulating a bias voltage and an arc current.

According to another aspect of the invention, a method for controlling an indirectly heated cathode ion source includes sensing a beam current extracted from the ion source, and controlling the beam current extracted from the ion source in response to an error value based on the difference between the sensed beam current and a reference extraction current. According to yet another aspect of the invention, a method for controlling a beam current extracted from an arc chamber includes providing an arc chamber housing defining an arc chamber having an extraction aperture; an extraction electrode positioned outside of the arc chamber in front of the extraction aperture; an indirectly heated cathode positioned within the arc chamber; a filament for heating the cathode; a filament power supply for providing current for heating the filament; a bias power supply coupled between the filament and the cathode; an arc power supply coupled between the cathode and the arc chamber housing; an extraction power supply, coupled between the arc chamber housing and the extraction electrode, for extracting from the arc chamber an ion beam having a beam current; and an ion source controller for controlling the beam current extracted from the arc chamber at or near a desired level, in response to an extraction current supplied by the extraction power supply.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
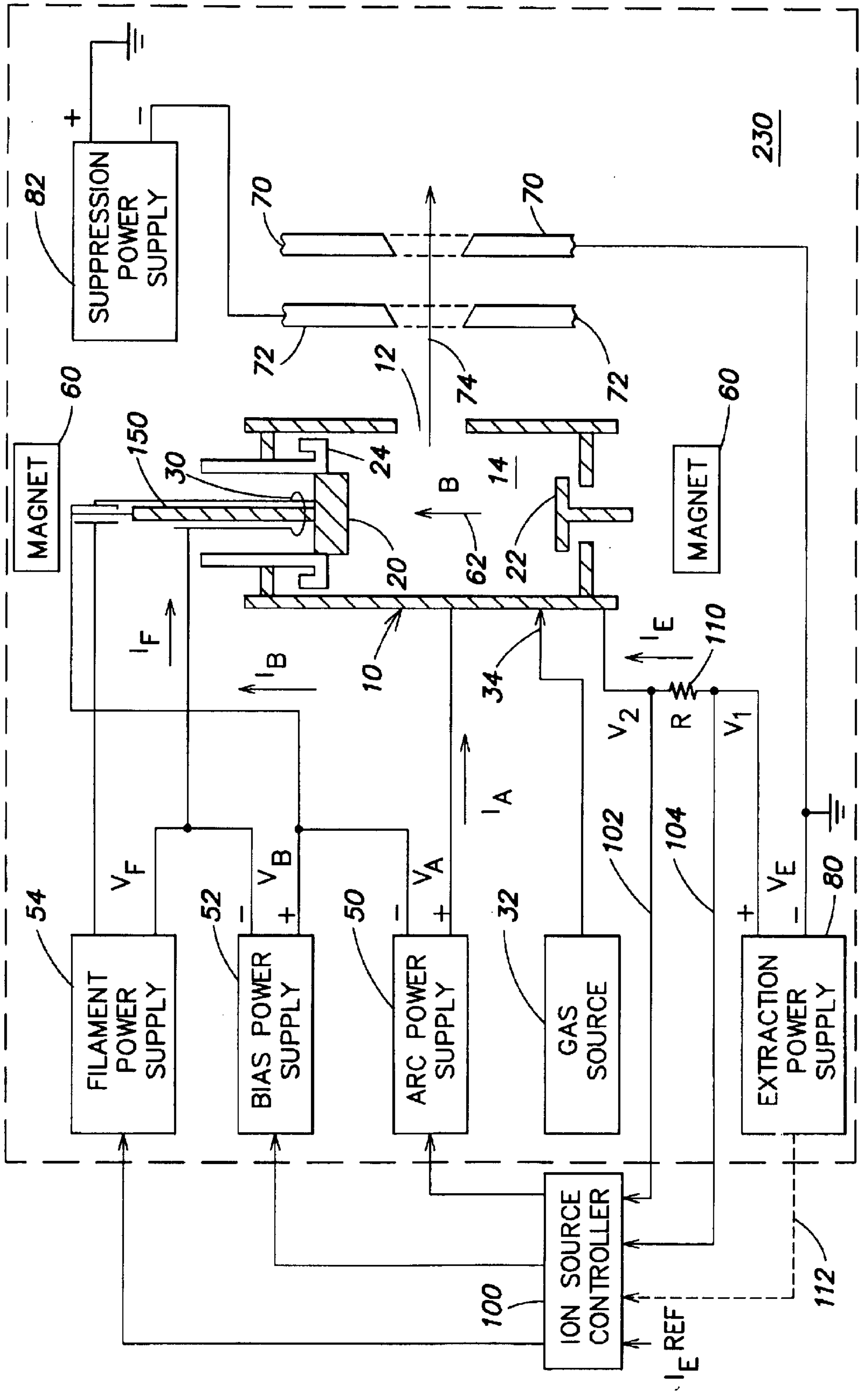
FIG. 1 is a schematic block diagram of an indirectly heated cathode ion source in accordance with an embodiment of the invention.

An indirectly heated cathode ion source in accordance with an embodiment of the invention is shown in FIG. 1. An arc chamber housing 10 having an extraction aperture 12 defines an arc chamber 14. A cathode 20 and a repeller electrode 22 are positioned within the arc chamber 14. The repeller electrode 22 is electrically isolated. A cathode insulator 24 electrically and thermally insulates cathode 20 from arc chamber housing 10. The cathode 20 optionally may be separated from insulator 24 by a vacuum gap to prevent thermal conduction. A filament 30 positioned outside arc chamber 14 in close proximity to cathode 20 produces heating of cathode 20.

A gas to be ionized is provided from a gas source 32 to arc chamber 14 through a gas inlet 34. In another configuration, not shown, arc chamber 14 may be coupled to a vaporizer which vaporizes a material to be ionized in arc chamber 14.

An arc power supply 50 has a positive terminal connected to arc chamber housing 10 and a negative terminal connected to cathode 20. Arc power supply 50 may have a rating of 100 volts at 10 amperes and may operate at about 50 volts. The arc power supply 50 accelerates electrons emitted by cathode 20 into the plasma in arc chamber 14. A bias power supply 52 has a positive terminal connected to cathode 20 and a negative terminal connected to filament 30. The bias power supply 52 may have a rating of 600 volts at 4 amperes and may operate at a current of about 2 amperes and a voltage of about 400 volts. The bias power supply 52 accelerates electrons emitted by filament 30 to cathode 20 to produce heating of cathode 20. A filament power supply 54 has output terminals connected to filament 30. Filament power supply 54 may have a rating of 5 volts at 200 amperes and may operate at a filament current of about 150 to 160 amperes. The filament power supply 54 produces heating of filament 30, which in turn generates electrons that are accelerated toward cathode 20 for heating of cathode 20. A source magnet 60 produces a magnetic field B within arc chamber 14 in a direction indicated by arrow 62. The direction of the magnetic field B may be reversed without affecting the operation of the ion source.

An extraction electrode, in this case a ground electrode 70, and a suppression electrode 72 are positioned in front of the extraction aperture 12. Each of ground electrode 70 and suppression electrode 72 have an aperture aligned with extraction aperture 12 for extraction of a well-defined ion beam 74.

An extraction power supply 80 has a positive terminal connected through a current sense resistor 110 to arc chamber housing 10 and a negative terminal connected to ground and to ground electrode 70. Extraction power supply 80 may have a rating of 70 kilovolts (kV) at 25 milliamps to 200 milliamps. Extraction supply 80 provides the voltage for extraction of ion beam 74 from arc chamber 14. The extraction voltage is adjustable depending on the desired energy of ions in ion beam 74.

A suppression power supply 82 has a negative terminal connected to suppression electrode 72 and a positive terminal connected to ground. Suppression power supply 82 may have an output in a range of −2 kV to −30 kV. The negatively biased suppression electrode 72 inhibits movement of electrons within ion beam 74. It will be understood that the voltage and current ratings and the operating voltages and currents of power supplies 50, 52, 54, 80 and 82 are given by way of example only and are not limiting as to the scope of the invention.

An ion source controller 100 provides control of the ion source. The ion source controller 100 may be a programmed controller or a dedicated special purpose controller. In a preferred embodiment, the ion source controller 100 is incorporated into the main control computer of the ion implanter.

The ion source controller 100 controls arc power supply 50, bias power supply 52 and filament power supply 54 to produce a desired level of extraction ion current from the ion source. By fixing the current extracted from the ion source, the ion beam is tuned for best transmission, which is beneficial for ion source life and defect reduction, because of fewer beam generated particles, less contamination and improved maintenance due to reduced wear from beam incidence. An additional benefit is faster beam tuning.

The ion source controller 100 may receive on lines 102 and 104 a current sense signal which is representative of extraction current $I_E$ supplied by extraction power supply 80. Current sense resistor 110 may be connected in series with one of the supply leads from extraction power supply 80 to sense extraction current $I_E$. In another arrangement, extraction power supply 80 may be configured for providing on a line 112 a current sense signal which is representative of extraction current $I_E$. The electrical extraction current $I_E$ supplied by extraction power supply 80 corresponds to the beam current in ion beam 74. The ion source controller 100 also receives a reference signal $I_E$REF which represents a desired or reference extraction current. The ion source controller 100 compares the sensed extraction current $I_E$ with the reference extraction current $I_E$REF and determines an error value, which may be positive, negative or zero.

Figure 5:
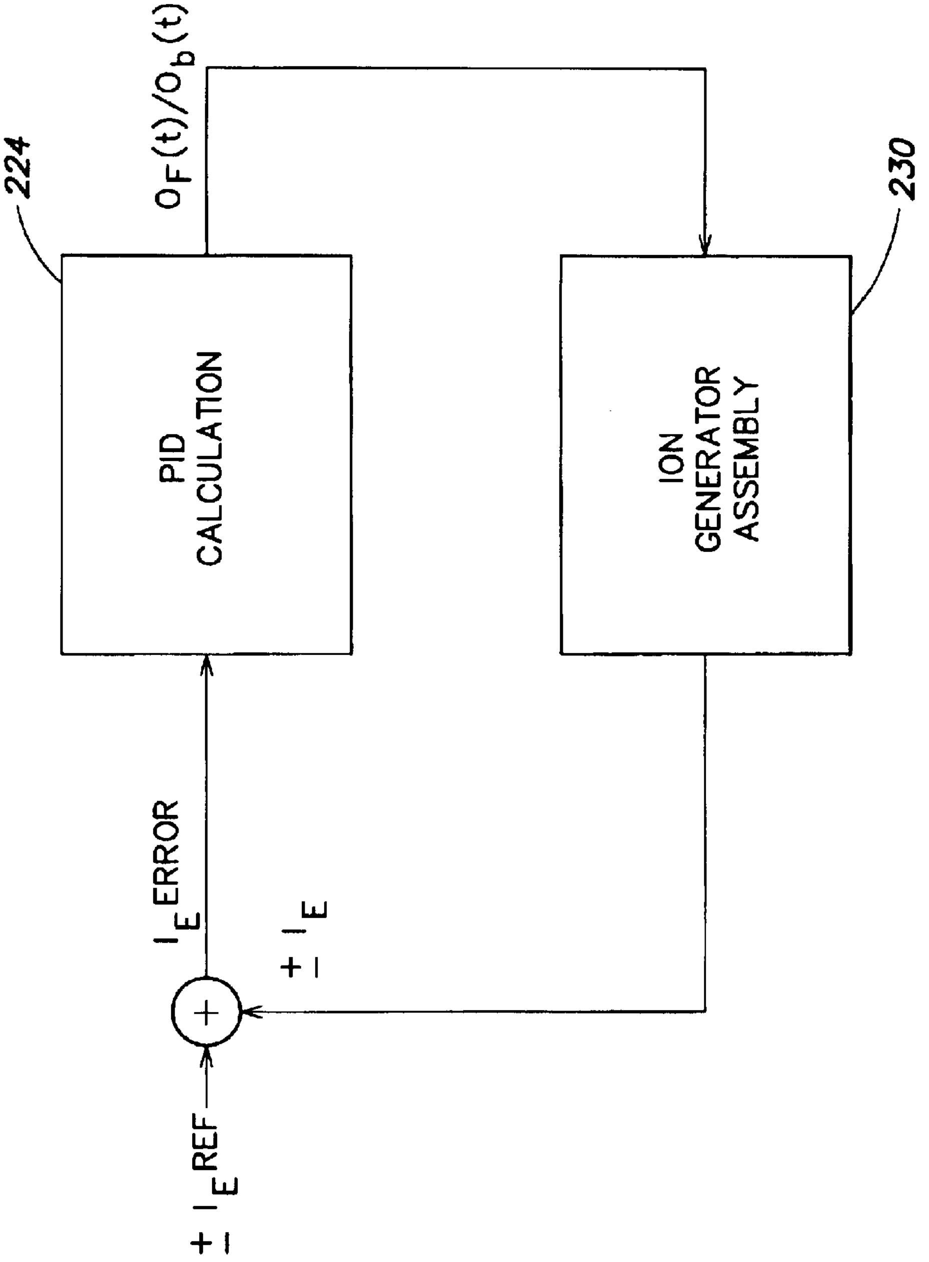
FIG. 5 schematically illustrates a feedback loop used to control extraction current for the ion source controller.

A control algorithm is used to adjust the outputs of the power supplies in response to the error value. One embodiment of the control algorithm utilizes a Proportional-Integral-Derivative (PID) loop, illustrated in FIG. 5. The goal of the PID loop is to maintain the extraction current $I_E$, used for generating the ion beam, at the reference extraction current $I_E$REF. The PID loop achieves this result by continually adjusting the output of a PID calculation 224 as required to adjust the sensed extraction current $I_E$ toward the reference extraction current $I_E$REF. The PID calculation 224 receives feedback from the ion generator assembly 230 (FIG. 1) in the form of an error signal $I_E$ERROR, generated by subtracting the sensed extraction current $I_E$ and reference extraction current $I_E$REF. The output of the PID loop may be fed from the ion source controller 100 to arc power supply 50, bias power supply 52 and filament power supply 54 to maintain the extraction current $I_E$ at or near the reference extraction current $I_E$REF.

According to a first control algorithm, the bias current $I_B$ supplied by bias power supply 52 (FIG. 1) is varied in response to the extraction current error value $I_E$ERROR so as to control the extraction current $I_E$ at or near the reference extraction current $I_E$REF. The bias current $I_B$ represents the electron current between filament 30 and cathode 20. In particular, the bias current $I_B$ is increased in order to increase the extraction current $I_E$, and the bias current $I_B$ is decreased in order to decrease the extraction current $I_E$ The bias voltage $V_B$ is unregulated and varies to supply the desired bias current $I_B$. Further, according to the first control algorithm, the filament current $I_F$ supplied by filament power supply 54 is maintained at a constant value, with the filament voltage $V_F$ being unregulated, and the arc voltage $V_A$ supplied by arc power supply 50 is maintained at a constant value, with the arc current $I_A$ being unregulated. The first control algorithm has the benefits of good performance, simplicity and low cost.

Figure 6:
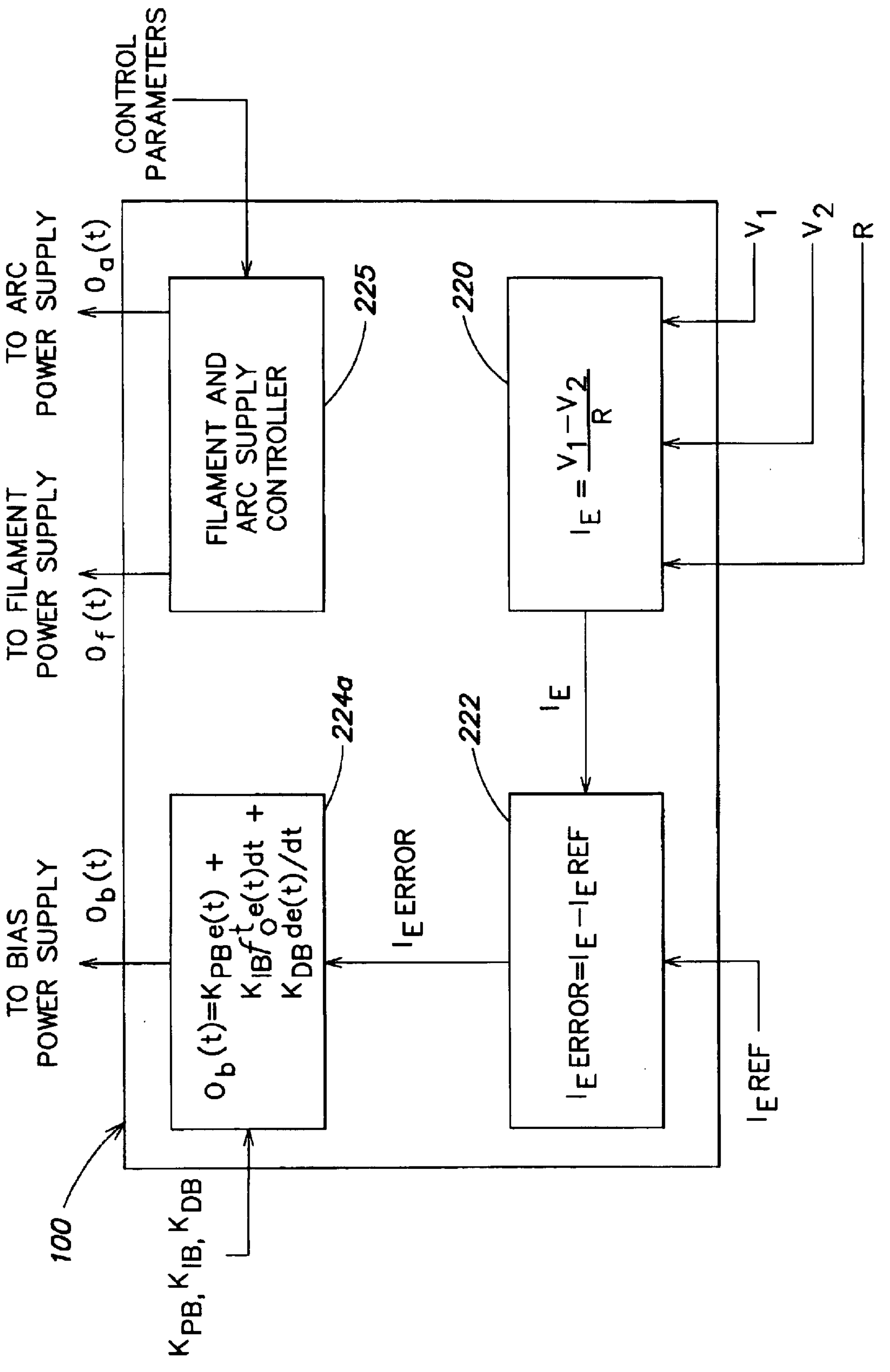
FIG. 6 schematically illustrates the operation of the ion source controller of FIG. 1 according to a first control algorithm.

An example of the operation of the ion source controller 100 according to the first control algorithm is schematically illustrated in FIG. 6. Inputs $V_1$, $V_2$, and R, designated in FIG. 1, are used to perform an extraction current calculation 220. Input voltages $V_1$ and $V_2$ are measured values, while input resistance R is based on the value of the resistor 110 (FIG. 1). The sensed extraction current $I_E$ is calculated as follows:

$$I_E=(V_1-V_2)/R$$

The above calculation may be omitted if the extraction power supply 80 is configured to provide a current sense signal, representative of extraction current $I_E$, to the ion source controller 100. The sensed extraction current $I_E$ and reference extraction current $I_E$REF are inputs to an error calculation 222. The reference extraction current $I_E$REF is a set value based on a desired extraction current. The extraction current error value $I_E$ERROR is calculated by subtracting the reference extraction current $I_E$REF from the sensed extraction current $I_E$, as follows:

$$I_E\text{ERROR}=I_E-I_E\text{REF}$$

The extraction current error value $I_E$ERROR and three control coefficients ($K_{PB}$, $K_{IB}$, and $K_{DB}$) are inputs for the PID calculation 224*a*. The three control coefficients are optimized to obtain the best control effect. In particular, $K_{PB}$, $K_{IB}$, and $K_{DB}$ are chosen to produce a control system having a transient response with acceptable rise time, overshoot, and steady-state error. The output signal of the PID calculation is determined as follows:

$$O_b(t)=K_{PB}e(t)+K_{IB}\int e(t)dt+K_{DB}de(t)/dt$$

where e(t) is the instantaneous extraction current error value and $O_b(t)$ is the instantaneous output control signal. The instantaneous output signal $O_b(t)$ is provided to the bias power supply 52, and provides information on how the bias current $I_B$ should be adjusted to minimize the extraction current error value. The magnitude and polarity of the output control signal $O_b(t)$ depends on the control requirements of bias power supply 52. In general, however, the output control signal $O_b(t)$ causes the bias current $I_B$ to increase when the sensed extraction current $I_E$ is less than the reference extraction current $I_E$REF and causes the bias current $I_B$ to decrease when the sensed extraction current $I_E$ is greater than the reference extraction current $I_E$REF.

The filament current $I_F$ and the arc voltage $V_A$ are maintained constant by a filament and arc power supply controller 225, shown in FIG. 6. Control parameters, chosen according to desired source operating conditions, are input to the filament and arc power supply controller 225. Control signals $O_f(t)$ and $O_a(t)$ are output by the controller 225 and are provided to the filament power supply 54 and the arc power supply 50, respectively.

In accordance with a second control algorithm, the filament current $I_F$ supplied by filament power supply 54 (FIG. 1) is varied in response to the extraction current error value $I_E$ERROR so as to control the extraction current $I_E$ at or near the reference extraction current $I_E$REF. In particular, the filament current $I_F$ is decreased in order to increase the extraction current $I_E$, and the filament current $I_F$ is increased in order to decrease the extraction current $I_E$. The filament voltage $V_F$ is unregulated. Further, according to the second control algorithm, the bias current $I_B$ supplied by bias power supply 52 is maintained constant, with bias voltage $V_B$ being unregulated, and arc voltage $V_A$ supplied by arc power supply 50 is maintained constant, with arc current $I_A$ being unregulated.

Figure 7:
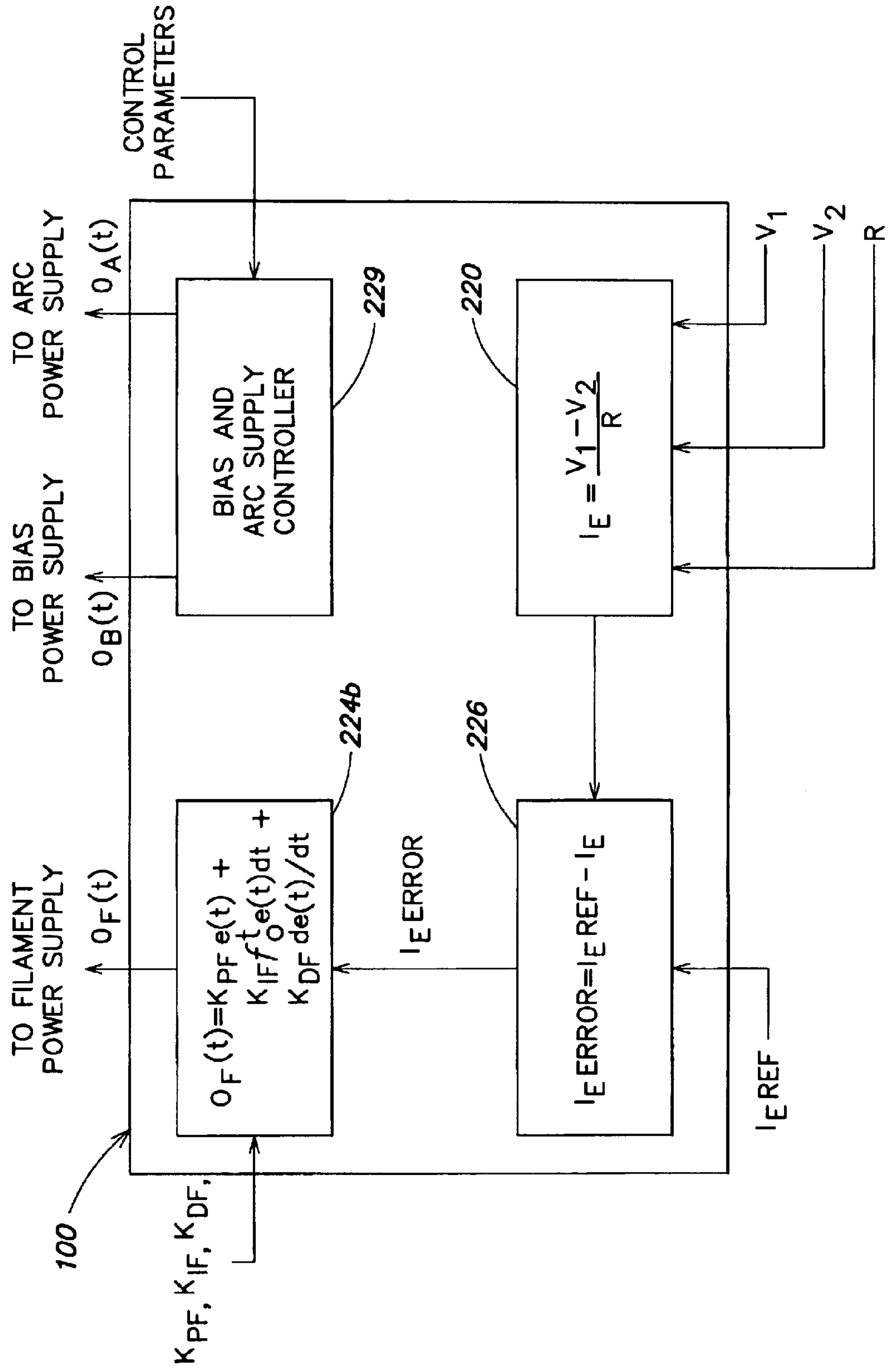
FIG. 7 schematically illustrates the operation of the ion source controller of FIG. 1 according to a second control algorithm.

The operation of the ion source controller 100 according to the second control algorithm is schematically illustrated in FIG. 7. The extraction current calculation 220 is performed as in the first control algorithm, based on inputs $V_1$, $V_2$, and R, to determine the sensed extraction current $I_E$. The sensed extraction current $I_E$ and reference extraction current $I_E$REF are inputs to an error calculation 226. The extraction current error value $I_E$ERROR is calculated by subtracting the sensed extraction current $I_E$ from the reference extraction current $I_E$REF, as follows:

$$I_E\text{ERROR}=I_E\text{REF}-I_E$$

This calculation differs from the error calculation of the first algorithm, in that the order of the operands is reversed. The operands are reversed so that the control loop creates an inverse relationship between the extraction current $I_E$ and the controlled variable (in this case, $I_F$), rather than a direct relationship, as in the first algorithm. The extraction current error value $I_E$ERROR and three control coefficients are inputs to a PID calculation 224*b*. The coefficients $K_{PF}$, $K_{IF}$, and $K_{DF}$ do not necessarily have the same values as the control coefficients of the first algorithm, as they are chosen to optimize the performance of the ion source according to the second control algorithm. However, the PID calculation 224*b* may be the same, as follows:

$$O_F(t)=K_{PF}e(t)+K_{IF}\int e(t)dt+K_{DF}de(t)/dt$$

An instantaneous output control signal $O_F(t)$ is provided to the filament power supply, and provides information on how the filament current $I_F$ should be adjusted to minimize the extraction current error value. The magnitude and polarity of the output control signal $O_F(t)$ depends on the control requirements of filament power supply 54. In general, however, the output control signal $O_F(t)$ causes the filament current $I_F$ to decrease when the sensed extraction current $I_E$ is less than the reference extraction current $I_E$REF and causes the filament current $I_F$ to increase when the sensed extraction current $I_E$ is greater than the reference extraction current $I_E$REF.

The bias current $I_B$ and the arc voltage $V_A$ are maintained constant by a bias and arc power supply controller 229, shown in FIG. 7. Control parameters, chosen according to desired source operating conditions, are input to the bias and arc power supply controller 229. Control signals $O_B(t)$ and $O_A(t)$ are output by the controller 229 and are provided to the bias power supply 52 and the arc power supply 50, respectively.

It should be appreciated that while the first control algorithm and second control algorithm are schematically represented separately, the ion source controller 100 may be configured to perform either or both algorithms. In the case where the ion source controller 100 is capable of performing both, a mechanism can be provided for selecting a particular algorithm to be implemented by the controller 100. It will be understood that different control algorithms may be utilized to control the extraction current of an indirectly heated cathode ion source. In a preferred embodiment, the control algorithm is implemented in software in controller 100. However, a hard-wired or microprogrammed controller may be utilized.

When the ion source is in operation, the filament 30 is heated resistively by filament current $I_F$ to thermionic emission temperatures, which may be on the order of 2200° C. Electrons emitted by filament 30 are accelerated by the bias voltage $V_B$ between filament 30 and cathode 20 and bombard and heat cathode 20. The cathode 20 is heated by electron bombardment to thermionic emission temperatures. Electrons emitted by cathode 20 are accelerated by arc voltage $V_A$ and ionize gas molecules from gas source 32 within arc chamber 14 to produce a plasma discharge. The electrons within arc chamber 14 are caused to follow spiral trajectories by magnetic field B. Repeller electrode 22 builds up a negative charge as a result of incident electrons and eventually has a sufficient negative charge to repel electrons back through arc chamber 14, producing additional ionizing collisions. The ion source of FIG. 1 exhibits improved source life in comparison with directly heated cathode ion sources, because the filament 30 is not exposed to the plasma in arc chamber 14 and cathode 20 is more massive than conventional directly heated cathodes.

Figure 2A:
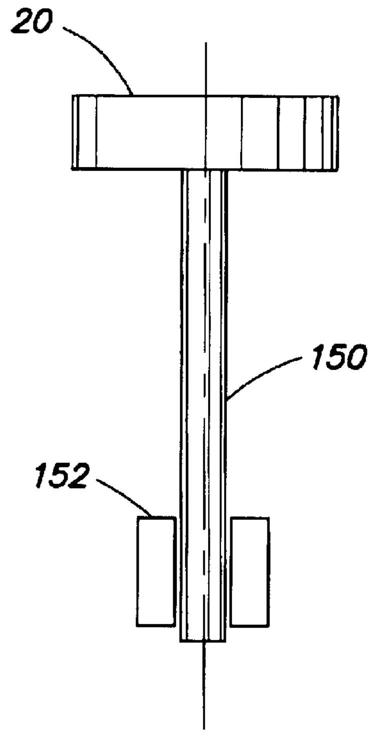
FIGS. 2A and 2B are front and perspective views, respectively, of an embodiment of the cathode in the ion source of FIG. 1.
Figure 2B:
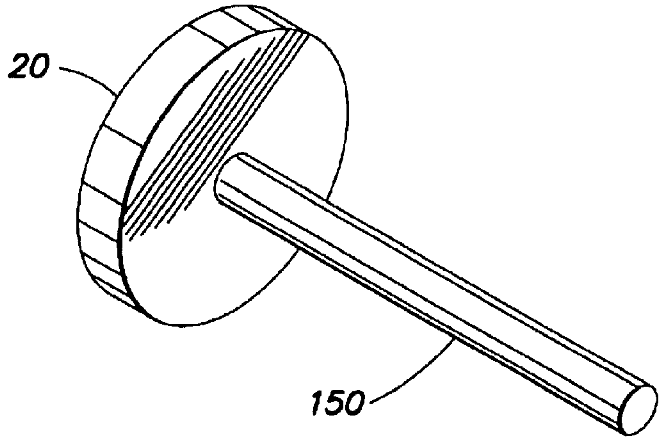
Figure 3A:
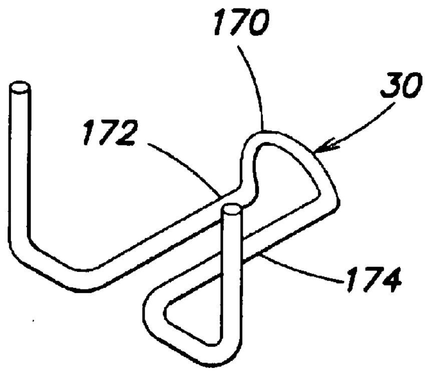
FIGS. 3A–3D are perspective, front, top and side views, respectively, of an embodiment of the filament in the ion source of FIG. 1.
Figure 3B:
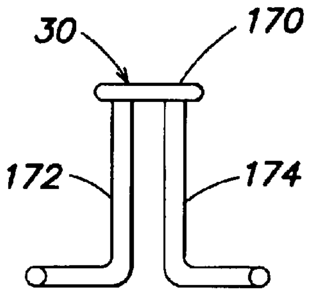
Figure 3C:
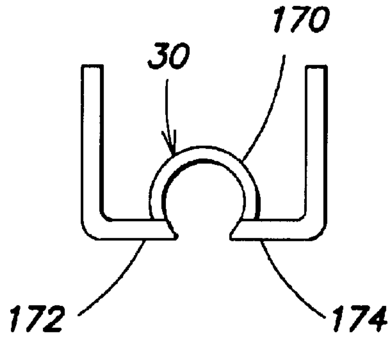
Figure 3D:
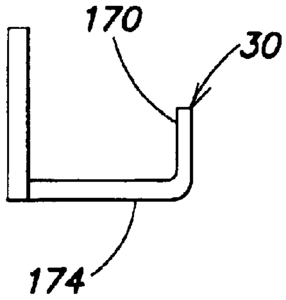

An embodiment of indirectly heated cathode 20 is shown in FIGS. 2A and 2B. FIG. 2A is a side view, and FIG. 2B is a perspective view of cathode 20. Cathode 20 may be disk shaped and is connected to a support rod 150. In one embodiment, the support rod 150 is attached to the center of disk shaped cathode 20 and has a substantially smaller diameter than cathode 20 in order to limit thermal conduction and radiation. In another embodiment, multiple support rods are attached to the cathode 20. For example, a second support rod, having a different size or shape than the first support rod, may be attached to the cathode 20 to inhibit incorrect installation of the cathode 20. A cathode subassembly including cathode 20 and support rod 150 may be supported within arc chamber 14 (FIG. 1) by a spring loaded clamp 152. The spring loaded clamp 152 holds in place the support rod 150, and is itself held in place by a supporting structure (not shown) for the arc chamber. Support rod 150 provides mechanical support for cathode 20 and provides an electrical connection to arc power supply 50 and bias power supply 52, as shown in FIG. 1. Because support rod 150 has a relatively small diameter, thermal conduction and radiation are limited.

In one example, cathode 20 and support rod 150 are fabricated of tungsten and are fabricated as a single piece. In this example, cathode 20 has a diameter of 0.75 inch and a thickness of 0.20 inch. In one embodiment, the support rod 150 has a length in a range of about 0.5 to 3 inches. For example, in a preferred embodiment, the support rod 150 has a length of approximately 1.75 inches and a diameter in a range of about 0.04 to 0.25 inch. In a preferred embodiment, the support rod 150 has a diameter of approximately 0.125 inch. In general, the support rod 150 has a diameter that is smaller than the diameter of the cathode 20. For example, the diameter of the cathode 20 may be at least four times larger than the diameter of the support rod 150. In a preferred embodiment, the diameter of the cathode 20 is approximately six times larger than the diameter of the support rod 150. It will be understood that these dimensions are given by way of example only and are not limiting as to the scope of the invention. In another example, cathode 20 and support rod 150 are fabricated as separate components and are attached together, such as by press fitting.

In general, the support rod 150 is a solid cylindrical structure and at least one support rod 150 is used to support cathode 20 and to conduct electrical energy to cathode 20. In one embodiment, the diameter of the cylindrical support rod 150 is constant along the length of the support rod 150. In another embodiment, the support rod 150 may be a solid cylindrical structure having a diameter that varies as a function of position along the length of the support rod 150. For example, the diameter of the support rod 150 may be smallest along the length of the support rod 150 at each end thereof, thereby promoting thermal isolation between the support rod 150 and the cathode 20. The support rod 150 is attached to the surface of cathode 20 which faces away from arc chamber 14. In a preferred embodiment, support rod 150 is attached to cathode 20 at or near the center of cathode 20.

An example of filament 30 is shown in FIGS. 3A–3D. In this example, filament is 30 is fabricated of conductive wire and includes a heating loop 170 and connecting leads 172 and 174. Connecting leads 172 and 174 are provided with appropriate bends for attachment of filament 30 to a power supply, shown as filament power supply 54 in FIG. 1. In the example of FIGS. 3A–3D, heating loop 170 is configured as a single arc-shaped turn having an inside diameter greater than or equal to the diameter of the support rod 150, so as to accommodate the support rod 150. In the example of FIGS. 3A–3D, heating loop 170 has an inside diameter of 0.36 inch and an outside diameter of 0.54 inch. Filament 30 may be fabricated of tungsten wire having a diameter of 0.090 inch. Preferably the wire along the length of the heating loop 170 is ground or otherwise reduced to a smaller cross-sectional area in a region adjacent to the cathode 20 (FIG. 1). For example, the diameter of the filament along the arc-shaped turn may be reduced to a smaller diameter, on the order of 0.075 inch, for increased resistance and increased heating in close proximity to cathode 20, and decreased heating of connecting leads 172 and 174. Preferably, heating loop 170 is spaced from cathode 20 by about 0.020 inch.

Figure 4A:
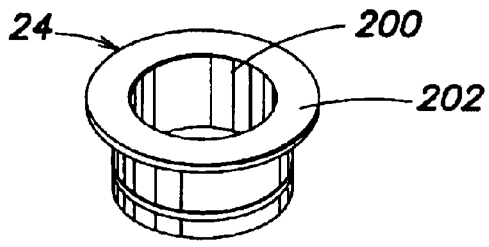
FIGS. 4A–4C are perspective, cross-sectional and partial cross-sectional views, respectively, of an embodiment of the cathode insulator in the ion source of FIG. 1.
Figure 4B:
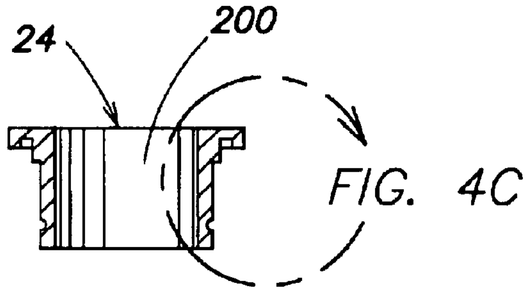
Figure 4C:
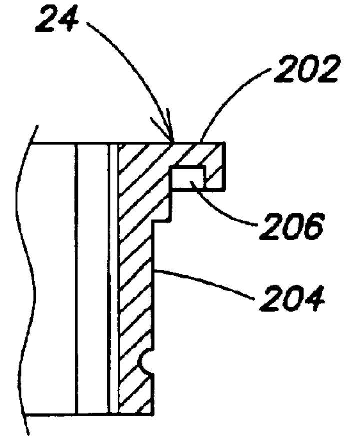

An example of cathode insulator 24 is shown in FIGS. 4A–4C. As shown, insulator 24 has a generally ring-shaped configuration with a central opening 200 for receiving cathode 20. Insulator 24 is configured to electrically and thermally isolate cathode 20 from arc chamber housing 10 (FIG. 1). Preferably, central opening 200 is dimensioned slightly larger than cathode 20 to provide a vacuum gap between insulator 24 and cathode 20 to prevent thermal conduction. Insulator 24 may be provided with a flange 202 which shields sidewall 204 of insulator 24 from the plasma in arc chamber 14 (FIG. 1). The flange 202 may be provided with a groove 206 on the side facing away from the plasma, which increases the path length between cathode 20 and arc chamber housing 10. This insulator design reduces the risk of deposits on the insulator causing a short circuit between cathode 20 and arc chamber housing 10. In a preferred embodiment, cathode insulator 24 is fabricated of boron nitride.

While there have been shown and described what are at present considered the preferred embodiments of the present invention, it will be obvious to those skilled in the art that various changes and modifications may be made therein without departing from the scope of the invention as defined by the appended claims. It should further be understood that the features described herein may be utilized separately or in any combination within the scope of the present invention.

What is claimed is:

1. An indirectly heated cathode ion source comprising:

an arc chamber housing defining an arc chamber having an extraction aperture;

an extraction electrode positioned outside of the arc chamber in front of the extraction aperture;

an indirectly heated cathode positioned within the arc chamber;

a filament for heating the cathode;

a filament power supply for providing current for heating the filament;

a bias power supply coupled between the filament and the cathode;

an arc power supply coupled between the cathode and the arc chamber housing;

an extraction power supply, coupled between the arc chamber housing and the extraction electrode, for extracting from the arc chamber an ion beam having a beam current; and an ion source controller for controlling the beam current extracted from the arc chamber at or near a reference extraction current, said ion source controller comprises a feedback controller for controlling a bias current supplied by said bias power supply or a filament current supplied by said filament power supply in response to an error value based on the difference between a sensed beam curren and the reference extraction current.

2. An ion source as defined in claim 1 further comprising an extraction current sensor for sensing an extraction power supply current that is representative of the extracted beam current.

3. An ion source as defined in claim 1 wherein said feedback means comprises a Proportional-Integral-Derivative controller.

4. An ion source as defined in claim 1 further comprising:

a suppression electrode positioned between the arc chamber housing and the extraction electrode; and a suppression power supply coupled between the suppression electrode and ground.

5. A method for controlling an indirectly heated cathode ion source comprising a cathode and a filament for heating the cathode, said method comprising the steps of:

sensing a beam current extracted from the ion source; and controlling a bias current between the filament and the cathode in response to an error value based on the difference between the sensed beam current and a reference extraction current.

6. The method as defined in claim 5 further comprising the steps of:

maintaining a filament current at a constant value; and maintaining an arc voltage at a constant value;

wherein a lament voltage and an arc current are unregulated.

7. A method for controlling an indirectly heated cathode ion source comprising a cathode and a filament for heating the cathode, said method comprising the steps of:

sensing a beam current extracted from the ion source; and controlling filament current through the filament in response to an error value based on the difference between the sensed beam current and a reference extra ion current.

8. The method as defined in claim 7 further comprising the steps of:

maintaining bias current at a constant value; and maintaining an arc voltage at a constant value;

wherein a bias voltage and an arc current are unregulated.

9. A method for controlling an indirectly heated cathode ion source comprising a cathode and a filament for heating the cathode, said method comprising the steps of:

sensing a be current extracted from the ion source; and controlling the beam current extracted from the ion source by a bias current between the filament and the cathode or a filament current through the filament in response to an error value based on the difference between the sensed beam current and a reference extraction current.

10. A method for controlling a beam current extracted from an arc chamber comprising the steps of:

providing an arc chamber housing defining an arc chamber having an extraction aperture;

providing an extraction electrode positioned outside of the arc chamber in front of the extraction aperture;

providing indirectly heated cathode positioned within the arc chamber;

providing a filament for heating the cathode;

providing a filament power supply for providing current for heating the filament;

providing a bias power supply coupled between the filament and the cathode;

providing a arc power supply coupled between the cathode and the arc chamber housing;

providing a extraction power supply, coupled between the arc chamber housing and the extraction electrode, for extracting from the arc chamber an ion beam having a beam current; and providing a ion source controller for controlling the beam current extracted from the arc chamber at or near a desired level, in response to an extraction current supplied by the extraction power supply.

* * * * *